United States Patent [19]

Suzuki et al.

[11] Patent Number: 4,694,498
[45] Date of Patent: Sep. 15, 1987

[54] AUTOMATIC SOUND FIELD CORRECTING SYSTEM

[75] Inventors: Shinichi Suzuki; Akio Tokumo; Yoshiro Kunugi; Masayuki Kato, all of Saitama, Japan

[73] Assignee: Pioneer Electronic Corporation, Tokyo, Japan

[21] Appl. No.: 793,417

[22] Filed: Oct. 31, 1985

[30] Foreign Application Priority Data

Oct. 31, 1984 [JP] Japan .................. 59-229987

[51] Int. Cl.⁴ .............................................. H04R 3/04
[52] U.S. Cl. ........................................ 381/103; 381/59
[58] Field of Search ................. 381/103, 107, 59, 111, 381/115

[56] References Cited

U.S. PATENT DOCUMENTS

| 3,207,848 | 9/1965 | Bore | 381/107 |
| 3,732,370 | 5/1973 | Sacks | 381/59 |
| 4,340,780 | 7/1982 | Odlen | 381/103 |
| 4,458,362 | 7/1984 | Berkowitz | 381/103 |
| 4,610,024 | 9/1986 | Schulhof | 381/103 |

FOREIGN PATENT DOCUMENTS

| 58-138200 | 8/1983 | Japan | 381/103 |
| 59-230315 | 12/1984 | Japan | 381/103 |
| 2068678 | 8/1981 | United Kingdom | 381/103 |

Primary Examiner—Gene Z. Rubinson
Assistant Examiner—L. C. Schroeder
Attorney, Agent, or Firm—Sughrue, Mion, Zinn, Macpeak and Seas

[57] ABSTRACT

An automatic sound field correcting system with graphic equalizer means to be provided in an audio signal supply line. A test signal such as a pink noise is radiated in the listening space and detected at a predetermined listening point to determine the detection frequency characteristic of the test signal, thereby to adjust the frequency characteristic of the graphic equalizer means. Thereafter, the frequency characteristic of the graphic equalized means is made equal to different band-pass filter characteristics, one after another, and each time the equalization is effected, the detected test signal is obtained through the grapic equalizer means for determination of the detected frequency characteristic of the test signal.

5 Claims, 5 Drawing Figures

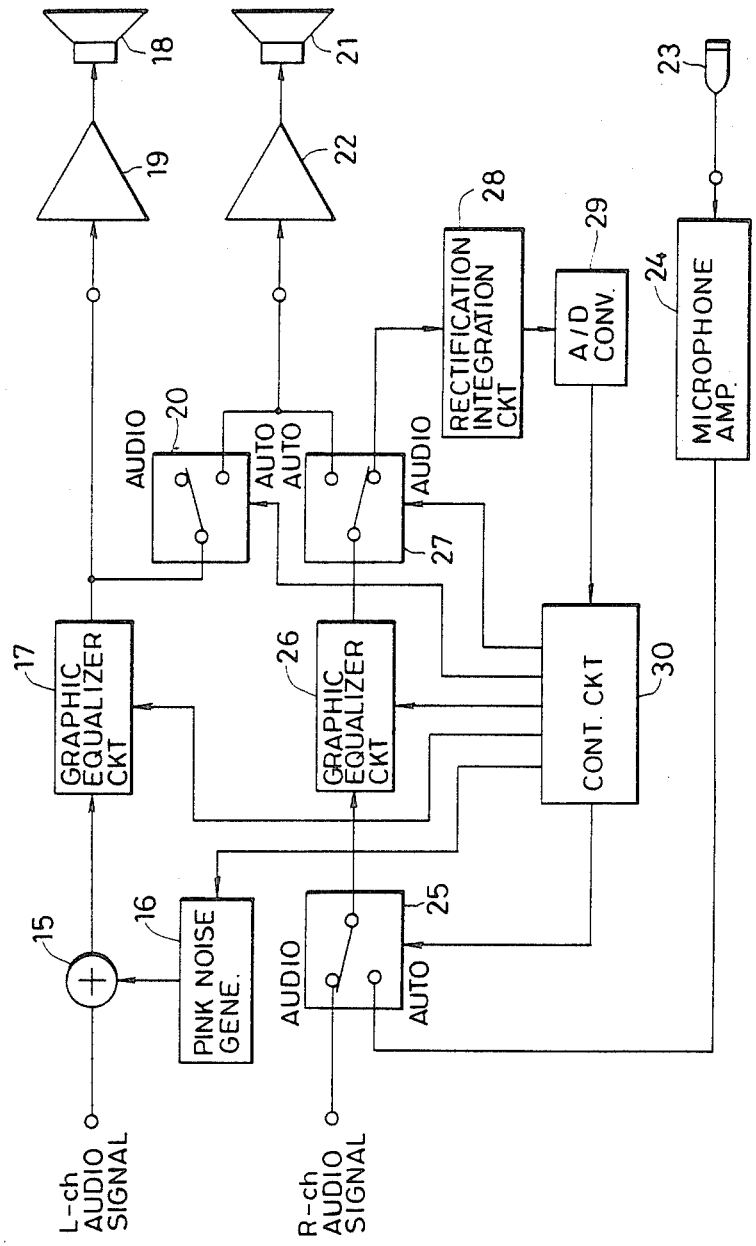

AUTOMATIC SOUND FIELD CORRECTING SYSTEM

BACKGROUND OF THE INVENTION

This invention relates to an automatic sound field correcting system.

In a conventional automatic sound field correcting system, a test signal such as a pink noise having a known frequency characteristic is radiated in the listening space. The signal sound is detected by a microphone and the frequency characteristic of a graphic equalizer circuit, provided in the audio signal line of a sound reproducing device, is controlled according to the detection frequency characteristic which is obtained from the detected signal. As a result the frequency characteristic of the sound field may be adjusted to permit desired reproduction of audio signals.

In the conventional automatic sound field correcting system, it is, in general, necessary to use a plurality of band-pass filters. Accordingly, such system ordinarily has an intricate arrangement of circuitry and involves high manufacturing costs.

SUMMARY OF THE INVENTION

Accordingly, an object of this invention is to eliminate the above-described difficulties accompanying a conventional automatic sound field correcting system.

More specifically, an object of this invention is to provide an automatic sound field correcting system which uses no band-pass filters, thus simplifying the circuitry and reducing the manufacturing cost.

The foregoing object and other objects of the invention have been achieved by the provision of an automatic sound field correcting system, which includes a graphic equalizer means in a audio signal supply line. A test signal having a known frequency characteristic is radiated in a listening space and is detected at a predetermined listening point to determine the detection frequency characteristic of the test signal. The frequency characteristic of the graphic equalizer means is adjusted according to that detection frequency characteristic. Further, according to the invention, in order to determine the detection frequency characteristic of the sound field, the frequency characteristic of the graphic equalizer means is converted sequentially into different band-pass filter characteristics corresponding to different test signals and, each time the conversion is effected, the test signal detected is stored and a composite sound field frequency characteristic consisting of all the different converted band-pass filter characteristics, is created.

The nature, principle and utility of the invention will become more apparent from the following detailed description when read in conjunction with the accompanying drawings.

BRIEF DESCRIPTION OF THE DRAWINGS

In the accompanying drawings:

FIG. 5 is a block diagram showing one application of the automatic sound field correcting system according to the invention.

DETAILED DESCRIPTION OF THE INVENTION

This invention will be described with reference to its preferred embodiments shown in the accompanying drawings.

Figure 1:
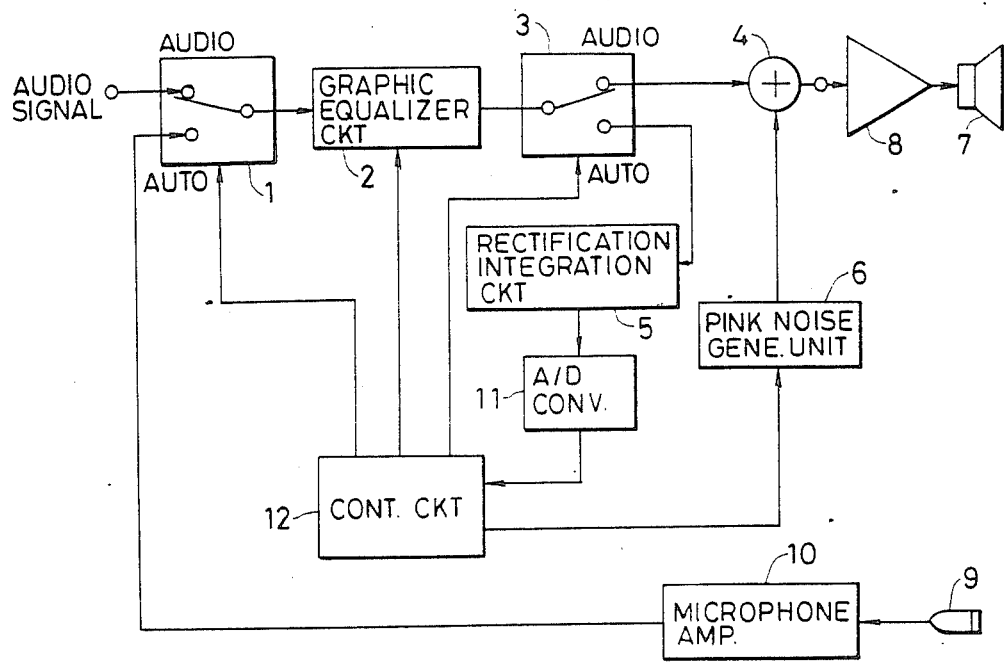
FIG. 1 is a block diagram showing one example of an automatic sound field correcting system according to this invention.

In an automatic sound field correcting system shown in FIG. 1, which is a first embodiment of the invention, an audio signal from a signal source such as a tape deck is applied through a signal change-over switch 3 to an adder 4 or a rectification integration circuit 5. The adder 4 receives a pink noise component signal from a pink noise generating unit. The output terminal of the adder 4 is the output terminal of the automatic sound field correcting device. The output terminal is connected to a power amplifier 8 to drive a loudspeaker 7. Sounds radiated from the loud-speaker 7 are received by a microphone 9, the output signal of which is supplied through a microphone amplifier 10 and the signal changeover switch 1 to the graphic equalizer circuit 2. The rectification integration circuit 5 is connected through an A/D (analog-to-digital) converter 11 to a control circuit 12, so that the output signal of the rectification integration circuit 5 is converted into a digital signal by the A/D converter 11, and the digital signal is supplied to the control circuit 12. The control circuit 12 is preferably made up of a microcomputer, which controls the switching operations of the signal change-over switches 1 and 3, the gain level in each adjustment band of the graphic equalizer circuit 2, and the noise generating operation of the noise generating unit 6. Each of the signal change-over switches 1 and 3 has two switching positions AUTO and AUDIO.

Figure 2:
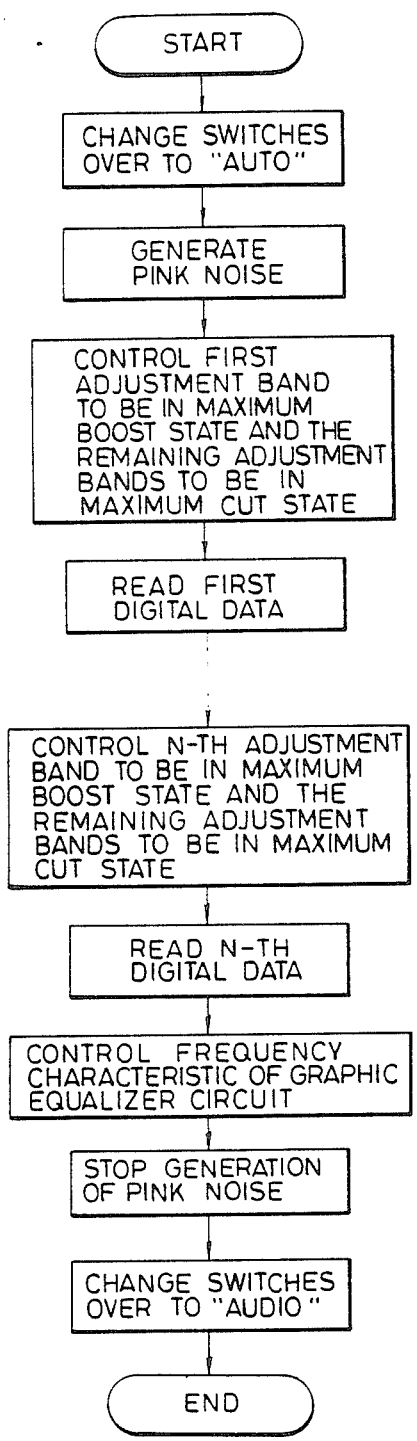
FIG. 2 is a flow chart for a description of the operation of a control circuit in the system in FIG. 1.

The operation of the automatic sound field correcting system thus organized will be described with reference to the operating procedure of the control circuit shown in FIG. 2.

Figure 3:
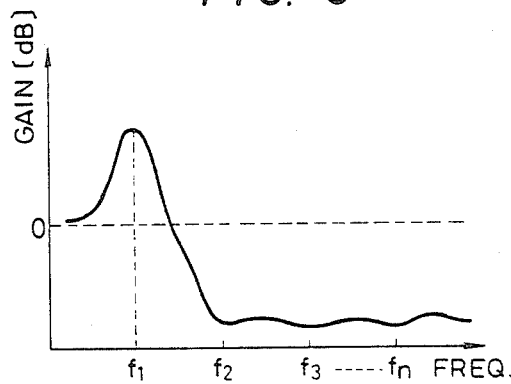
FIGS. 3 and 4 are characteristic waveform diagrams for a description of the band-pass filter operation of a graphic equalizer circuit in the system of FIG. 1.
Figure 4:
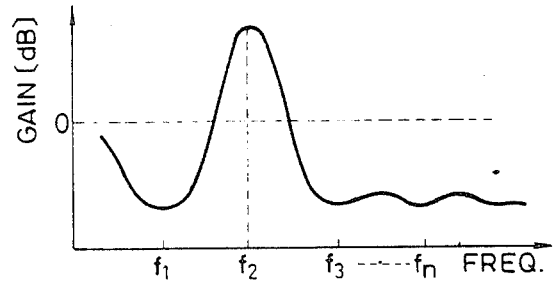

In response to an automatic sound field correcting START instruction from a key board (not shown), the control circuit 12 causes each of the switches 1 and 3 to trip its armature over to the position AUTO, and operates the pink noise generating unit 6. As a result, a pink noise component signal is supplied through the adder 4 to the power amplifier 8, and a pink noise is radiated by the loudspeaker 7. The pink noise thus radiated is received by the microphone 9. The output signal of the microphone 9 is amplified by the microphone amplifier 10 and supplied through the signal change-over switch 1 to the graphic equalizer circuit 2. Under this condition, the first adjustment band is placed in maximum boost state by the control circuit 12 and the remaining second through n-th adjustment bands are placed in maximum cut state. Accordingly, the frequency characteristic of the graphic equalizer 2 becomes equal to that of a band-pass filter (BPF), having the center frequency $f_1$ of the graphic equalizer 2 as its center frequency, as shown in FIG. 3. The signal passed through the graphic equalizer 2 is supplied through the signal change-over switch 3 to the rectification integration circuit 5, where it is converted into a DC signal. The DC signal is converted into digital data by the A/D converter 11. The digital data is supplied to the control circuit 12 so as to be stored.

Next, of the adjustment bands of the graphic equalizer circuit 2, only the second adjustment band is placed in a maximum boost state, and the first adjustment band is placed in a maximum cut state, as are the third through n-th adjustment bands. Therefore, the frequency characteristic of the graphic equalizer circuit 2 becomes equal to that of a band-pass filter having the center frequency of the second adjustment band as its center frequency. In this operation, digital data supplied from the A/D converter 11 to the control circuit 12 is stored. The above-described operation is repeatedly carried out for the remaining adjustment bands. The composite digital data thus obtained represents the frequency characteristic of the sound field.

In order to obtain a desired sound field frequency characteristic according to the digital data, the frequency characteristic of the graphic equalizer circuit 2, i.e., the gain levels of the adjustment bands, are adjusted. Thereafter, the operation of the pink noise generating unit 6 is stopped, and the armature of each of the switches 1 and 3 are tripped over to the position AUDIO. Thus, the automatic sound correcting operation has been accomplished.

FIG. 5 shows a second embodiment of the invention, i.e., an example of the automatic sound field correcting system which is applied to a two-channel sound reproducing device.

In the device, the audio signal of the left-channel is applied to an adder 15, to which a pink noise component signal is applied by a pink noise generating unit 16. The output signal of the adder 15 is supplied to a graphic equalizer circuit 17. The output signal of the graphic equalizer circuit 17 is applied to a power amplifier 19 to drive a left-channel loudspeaker 21. Sounds radiated by the loudspeakers 18 and 21 are received by a microphone 23. The output signal of the microphone 23 is supplied through a microphone amplifier 24 and a signal change-over switch 25 to a graphic equalizer circuit 26.

On the other hand, the audio signal of the right-channel is applied through the signal change-over switch 25 to the graphic equalizer circuit 26. The output signal of the graphic equalizer circuit 26 is applied through a signal change-over switch 27 to the power amplifier 22 or a rectification integration circuit 28. The rectification integration circuit 28 is connected through an A/D converter 29 to a control circuit 30. The control circuit 30 operates to control the switching operations of the signal change-over switches 20, 25 and 27, the frequency characteristics of the graphic equalizers 17 and 26, and the noise generating operation of the pink noise generating unit 16.

In the automatic sound correcting system thus organized, in response to an automatic sound field correction START instruction, the control circuit 30 changes each of the switches 20, 25 and 27 to the position AUTO. As a result, the graphic equalizer circuit 26 is used as a band-pass filter. Next, the frequency characteristic of the graphic equalizer circuit 17 is made flat, and the pink noise generating circuit 16 is operated. The pink noise component signal outputted by the pink noise generating circuit 16 is supplied through the adder 15 and the graphic equalizer circuit 17 to the power amplifier 19, and through the signal change-over switch 20 to the power amplifier 22, so that the loudspeakers 18 and 21 output a pink noise. The pink noise is detected by the microphone 23. The detection signal of the microphone 23 is amplified by the microphone amplifier 24, the output signal of which is applied through the signal change-over switch 25 to the graphic equalizer circuit 26. The graphic equalizer circuit 26, being controlled by the control circuit 30, operates a band-pass filter similarly as in the case of the graphic equalizer circuit 2 shown in FIG. 1. Thus, the control circuit 30 controls the gain levels of the adjustment bands of the graphic equalizer circuit 17 according to the data which are successively supplied by the A/D converter 29.

Next, the control circuit 30 uses the graphic equalizer circuit 26 as a band-pass filter again, and controls the gain levels of the adjustment bands of the graphic equalizer circuit 17 according to the data provided by the A/D converted 29. This operation is repeatedly carried out until the desired sound field frequency characteristic is obtained. Then, the operation of the pink noise generating unit 16 is stopped, the signal change-over switches 20, 25 and 27 are caused to take the positions AUDIO, respectively, and the gain levels of the adjustment bands of the graphic equalizer circuit 26 are controlled in response to the changing frequencies in a manner similar to the graphic equalizer circuit 17. Thus, the automatic sound field correcting operating has been accomplished.

As is apparent from the above description of the automatic sound field correcting system that comprises the invention, the graphic equalizer circuit which is used to correct the reproduction characteristic of the audio signal and thereby obtain a desired sound field frequency characteristic, is used as a band-pass filter in the automatic sound field correcting operation. Therefore, it is unnecessary for the system to have its own band-pass filter. Accordingly, the system is simple in the arrangement of circuitry and is low in manufacturing cost.

What is claimed is:

1. A circuit for adjusting the frequency characteristics of a graphic equalizer that is adjustable in amplitude for each of a plurality of frequency bands, said circuit comprising:

test signal generating means adapted to provide an input to said equalizer, detector means adapted to detect the output of said equalizer, and control means adapted to adjust the amplitude of a plurality of combinations of said equalizer frequency bands to generate a composite frequency characteristic;

wherein said control means is responsive to the output of said detector means to maximize the amplitude of at least one of said frequency bands, whereby said circuit is adapted to provide the response of a band-pass filter having a center frequency equal to the center frequency of said maximized frequency band; and wherein said control means is adapted to operate sequentially, for each step in the sequence at least one frequency band amplitude is maximized and the remaining frequency band amplitudes are minimized, and said control means stores the output from the output from the detector means and generates a composite control signal that optimally adjusts the amplitude of each equalizer frequency band whereby said circuit is adapted to provide the response of a series of band-pass filters, each having a center frequency which is equal to the center frequency of a respective frequency band.

2. The circuit in claim 1 wherein said control means is adapted to switch said equalizer into and out of an audio circuit, comprising a connection between a source of audio signals and a speaker means, and to turn the test signal source off when said equalizer is switched into said audio circuit.

3. An automatic sound field correction system for connection between a source of audio signal at an input and audio speaker means at an output, said system comprising:

equalizer means having a plurality of adjustable frequency bands;

test signal generation means;

transducer means adapted to receive the sound from said audio speaker means;

digital conversion means, said means adapted to convert an output of said equalizer means into a digital signal;

switch means adapted in a first mode to connect said equalizer means between said source and said audio speaker means and in a second mode to disconnect said equalizer means from said source and said audio speaker means and to connect said equalizer means between said transducer means and said digital conversion means; and control means connected to said equalizer means and adapted to selectively adjust the amplitude of the frequency bands of said equalizer means in a sequence of steps whereby a composite control signal is generated.

4. The automatic sound field correcting system as claimed in claim 3 wherein said equalizer means comprises at least two graphic equalizer circuits, each connected into a separate audio channel and each having a plurality of adjustable frequency bands which are controlled and amplitude by a said control means.

5. The automatic sound field correcting system as claimed in claim 3 wherein said control means is adapted to operate sequentially, for each step in the sequence at least one frequency band amplitude is maximized and said control means is adapted to store the output of said detector circuit and to generate a composite control signal that adjusts the amplitude of each equalizer means frequency band whereby said equalizer means performs as a series of band-pass filters each having a center frequency equal to the center frequency of a respective frequency band.

* * * * *